United States Patent
Barrow et al.

(10) Patent No.: US 7,760,004 B2
(45) Date of Patent: Jul. 20, 2010

(54) CLAMP NETWORKS TO INSURE OPERATION OF INTEGRATED CIRCUIT CHIPS

(75) Inventors: Jeffrey G. Barrow, Tuscon, AZ (US); Hio Leong Chao, Tuscon, AZ (US); Sheetal Gupta, Tuscon, AZ (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/290,487

(22) Filed: Oct. 30, 2008

(65) Prior Publication Data

US 2010/0109740 A1    May 6, 2010

(51) Int. Cl.
*H03L 5/00*    (2006.01)

(52) U.S. Cl. .................. 327/328; 327/313; 327/320

(58) Field of Classification Search ............... 327/309, 327/319, 320, 327, 328, 313
See application file for complete search history.

(56) References Cited

U.S. PATENT DOCUMENTS

| | | | | |
|---|---|---|---|---|
| 3,916,220 A * | 10/1975 | Roveti | .................. | 361/98 |
| 4,558,286 A * | 12/1985 | Neidorff | .................. | 330/252 |
| 4,975,798 A | 12/1990 | Edwards et al. | .................. | 361/56 |
| 5,565,790 A | 10/1996 | Lee | .................. | 326/30 |
| 5,838,529 A | 11/1998 | Shufflebotham et al. | .... | 361/234 |
| 6,028,466 A | 2/2000 | Hartley | .................. | 327/328 |
| 6,400,179 B1 * | 6/2002 | Armstrong et al. | .................. | 326/30 |
| 6,590,442 B2 | 7/2003 | Byeon et al. | .................. | 327/537 |
| 6,670,939 B2 | 12/2003 | Yang et al. | .................. | 345/98 |
| 6,756,834 B1 | 6/2004 | Tong et al. | .................. | 327/309 |
| 6,876,351 B2 | 4/2005 | Tokonami et al. | .................. | 345/98 |
| 6,897,703 B2 * | 5/2005 | Hunt | .................. | 327/313 |
| 6,927,957 B1 | 8/2005 | Bakulin et al. | .................. | 361/56 |
| 7,002,373 B2 | 2/2006 | Chang | .................. | 326/81 |
| 7,023,241 B2 | 4/2006 | Chang | .................. | 326/68 |
| 7,199,636 B2 * | 4/2007 | Oswald et al. | .................. | 327/325 |
| 2009/0115460 A1 * | 5/2009 | Wang et al. | .................. | 327/63 |

OTHER PUBLICATIONS

Application Note 4032, "HFTA-16.0: ESD Protection for Bipolar Integrated Circuits", Maxim Integrated Products, Sunnyvale, California, Apr. 5, 2007, 8 pages.
Katz, David, "Blackfin Processor's Parallel Peripheral Interface Simpifies LCD Connection in Portable Mulimedia", Analog Dialogue, vol. 39, Jan. 2005, 4 pages.

* cited by examiner

*Primary Examiner*—Lincoln Donovan
*Assistant Examiner*—William Hernandez
(74) *Attorney, Agent, or Firm*—Koppel, Patrick, Heybl & Dawson

(57) ABSTRACT

Clamp networks are provided to insure successful operation of a variety of electronic circuits that are realized in the form of integrated circuit chips. These networks are especially suited for use in chips in which on-chip circuits generate a voltage to bias the chip substrate relative to the chip ground. The clamp networks are configured to drive a current between the chip ground and the chip substrate whenever the chip substrate begins to rise above the chip ground during turn on of the chip input voltage. The clamp networks thus insure that the chip substrate is properly biased when the input voltage has been established and that the chip, therefore, functions as intended.

17 Claims, 2 Drawing Sheets

US 7,760,004 B2

CLAMP NETWORKS TO INSURE OPERATION OF INTEGRATED CIRCUIT CHIPS

BACKGROUND OF THE INVENTION

1. Field of the Invention

The present invention relates generally to integrated circuit chips.

2. Description of the Related Art

Modern integrated circuit chips generally include large numbers of circuit elements such as transistors, capacitors and resistors that are arranged to provide numerous electronic systems. Typically, these circuit elements are physically constructed in a circuit substrate that is formed of a semiconductor such as silicon. To insure proper circuit operation, the chip structure must include some form of circuit isolation so that the various circuit elements properly interact with each other.

An exemplary form of isolation is constructed by the following method (which assumes use of a silicon semiconductor):

a) a substrate is formed of P-type silicon;
b) N-type silicon diffusion islands are formed in the P-type silicon substrate; and
c) circuit elements are constructed into the N-type islands.

For example, an N-type island may be a well into which is formed a P-type metal-oxide-semiconductor (MOS) transistor. Alternatively, an N-type island may form the collector of an NPN bipolar junction transistor.

To insure proper circuit operation, the N-type islands are then generally biased with a higher voltage than is the P-type silicon substrate so that the associated PN junctions are reversed biased. This generally means that the circuit substrate is biased negatively with respect to a circuit ground. With the N-type islands turned off (i.e., reverse biased) with respect to the silicon substrate, circuit elements are now properly isolated to insure intended circuit operation. Failure to achieve this isolation risks circuit malfunction and possibly destructive latch-up.

BRIEF SUMMARY OF THE INVENTION

The present disclosure is generally directed to integrated circuit chips and to chip structures that insure intended chip functions. The drawings and the following description provide an enabling disclosure and the appended claims particularly point out and distinctly claim disclosed subject matter and equivalents thereof.

DETAILED DESCRIPTION OF THE INVENTION

Figure 6:
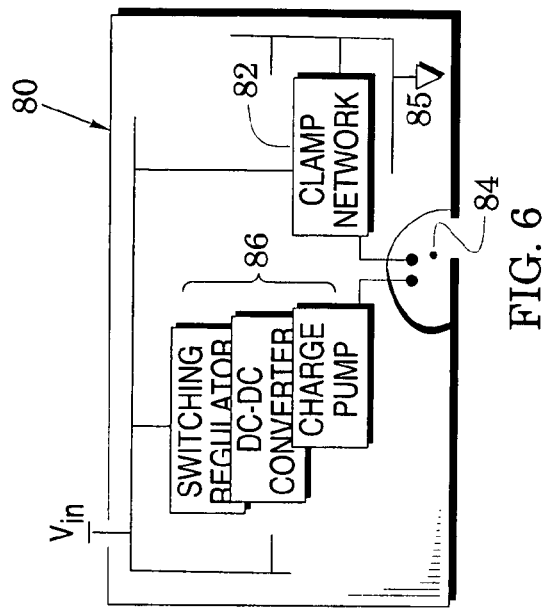
FIG. 6 is a diagram of an integrated circuit chip that includes a clamp network embodiment to insure proper chip operation.

FIGS. 1-4 illustrate various clamp network embodiments that are especially useful for insuring successful operation of a variety of electronic circuits that are realized in the form of integrated circuit chips. Although they can be used in any integrated circuit chip, these embodiments are especially suited for use in chips in which on-chip circuits generate a voltage to bias the chip substrate. Accordingly, FIGS. 5 and 6 describe chip structures and exemplary uses and functions of the clamp networks of FIGS. 1-4 to thereby insure successful chip operation. Because an understanding of the network embodiments facilitates a description of their use and functions, attention is initially directed to FIG. 1.

Figure 1:
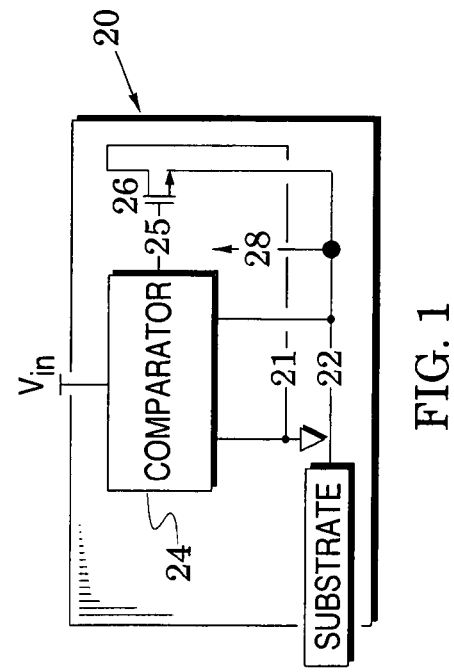
FIG. 1 illustrates a clamp network embodiment of the present disclosure.

The clamp network embodiment 20 of FIG. 1 is arranged to clamp the potential of a second integrated circuit structure 22 relative to the potential of a first integrated circuit structure 21. Although, in general, they can be any of various integrated circuit structures, the first and second integrated circuit structures are shown, for exemplary purposes, as a circuit ground 21 and a circuit substrate 22.

The network 20 includes a comparator 24 and a clamp transistor 26 that has a control terminal 25. The clamp transistor 26 is coupled to provide a current between the circuit ground 21 and the circuit substrate 22 in response to a comparison signal at its control terminal 25. The comparator 24 is coupled to the circuit ground 21 and the circuit substrate 22 and provides a comparison signal to the control terminal 25 that indicates differences between potentials of the circuit ground and the circuit substrate.

In operation of the network 20, the comparator 24 senses when the circuit substrate 22 rises above the circuit ground 21 as indicated by a rising arrow 28 attached to the circuit substrate. In response, the comparator adjusts the comparison signal to cause the clamp transistor to conduct a current which reduces the potential of the circuit substrate so that it is restrained to not exceed the potential of the circuit ground. The network thus clamps the potential of the circuit substrate relative to the potential of the circuit ground.

Figure 2:
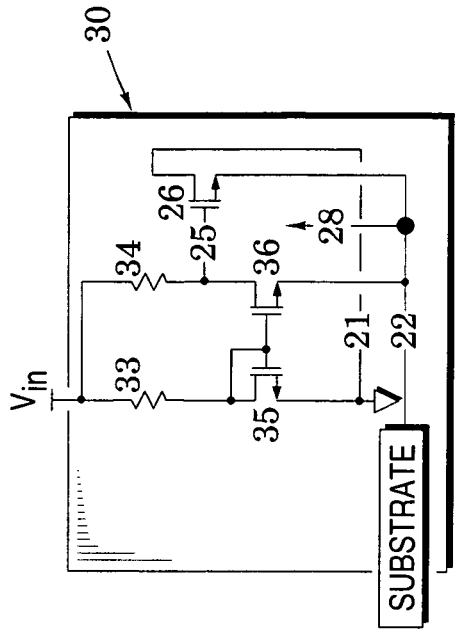
FIGS. 2-4 illustrate additional clamp network embodiments.

FIG. 2 illustrates a clamp network embodiment 30 that includes elements of the network 20 with like elements indicated by like reference numbers. In the network 30, the comparator 24 of FIG. 1 is formed with first and second resistors 33 and 34, a diode-coupled transistor 35, and a second transistor 36. The diode-coupled transistor 35 is coupled between the first resistor 33 and circuit ground 21. The second transistor 36 is coupled between the second resistor 34 and the circuit substrate 22 and the second transistor is gate-coupled to the diode-coupled transistor. Finally, the control terminal 25 of the clamp transistor 26 is coupled to the junction between the second resistor 34 and the second transistor 36.

The first and second resistors 33 and 34, the diode-coupled transistor 35, and the second transistor 36 thus form a comparator with a gain that approximately equals the product of the transconductance $g_m$ of the second transistor 36 times the parallel combination of the resistance of the second resistor 34 and the output impedance of the second transistor 36.

In a network embodiment, the first and second resistors are equally sized and the diode-coupled transistor 35 is physically scaled to the second transistor 36 so that voltage across the diode-coupled transistor substantially matches the turn-on voltage of the second transistor 36. Accordingly, the second transistor 36 will begin to turn on whenever the potential of the circuit substrate 22 begins to rise above the potential of the circuit ground as indicated by the rising arrow 28.

In a typical initiation of the operation of the network 30, it is assumed that the voltage supply to the network begins at zero and then rises to its final value of $V_{in}$. As the input voltage rises, the potential of the circuit substrate 22 may remain below the potential of the circuit ground or it may rise above that potential as indicated by the rising arrow 28. As long as the potential of the circuit substrate 22 remains below the potential of the circuit ground 21, the second transistor 36 is biased in an on condition because its base-to-drain voltage exceeds its turn on voltage. Accordingly, current through the second transistor 36 pulls the voltage of the gate 25 low and this voltage, therefore, is not sufficient to turn on the clamp transistor 26.

If, instead, the potential of the circuit substrate 22 rises above the potential of the circuit ground 21 as indicated by the rising arrow 28, the base-to-drain voltage of the second transistor is not sufficient to turn it on so that it no longer pulls the voltage of the gate 25 low. This allows the resistor 34 to pull the gate high and turn on the clamp transistor 26. Current flow through the clamp transistor pushes its source (and, hence, the circuit substrate 22) negative with respect to circuit ground. Therefore, as the network voltage rises to its final value of $V_{in}$, the structure of the clamp network 20 is arranged to assure that the potential of the circuit substrate 22 never rises above the potential of the circuit ground 21.

It is noted that the sizing of the diode-coupled transistor 35 and the second transistor 36 could be altered in the network 20 to adjust the threshold of the comparator action described above. For example, the sizing could be altered so that the second transistor turns on when the circuit substrate 22 is somewhat below or somewhat above the potential of the circuit ground 21.

Figure 3:
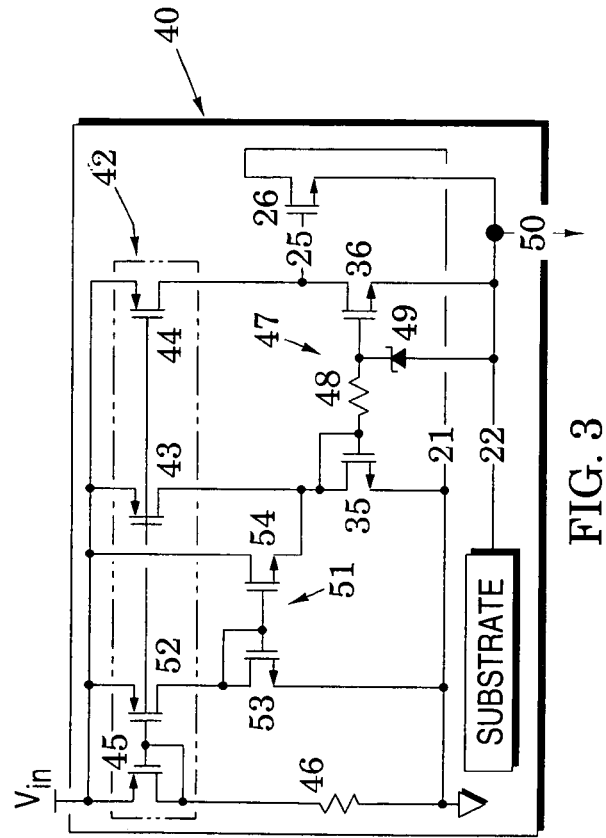
Figure 4:
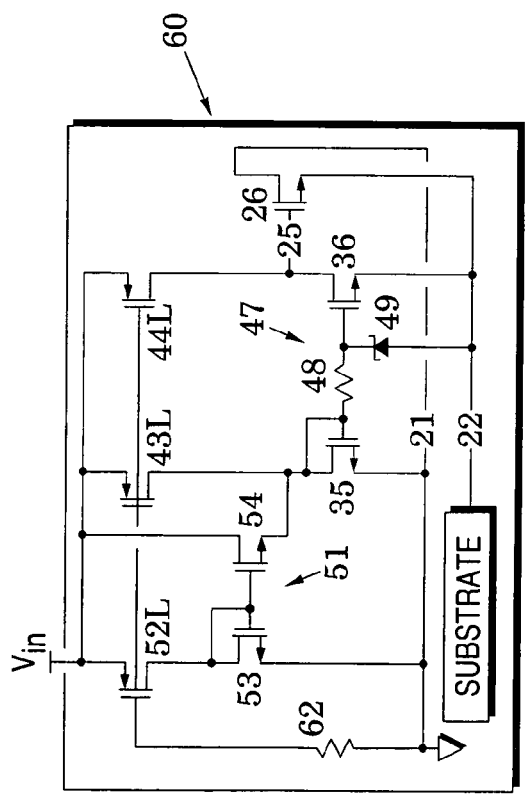

FIG. 3 illustrates another clamp network embodiment 40 that includes elements of the network 30 of FIG. 2 with like elements indicated by like reference numbers. In contrast, however, the resistors 33 and 34 are respectively replaced by mirror transistors 43 and 44 of a current mirror 42.

In the current mirror, the mirror transistors 43 and 44 are gate-coupled to a diode-coupled transistor 45 that is coupled in series with a resistor 46 and also coupled to the input voltage $V_{in}$. The current through the diode-coupled transistor 45 is established by the voltage across the resistor and is then gate-mirrored to the transistors 43 and 44 with their currents determined by their sizing relative to that of the diode-coupled transistor 45. The current from the mirror transistors 43 and 44 is delivered with impedances that are substantially higher than that of the resistors 33 and 34 of the network 30.

The comparator introduced in FIG. 1 is now formed by the diode-coupled transistor 35, the second transistor 36 and the output impedances of the mirror transistors 43 and 44. The gain of this comparator structure is the product of the transconductance $g_m$ of the second transistor 36 times the parallel combination of the output impedances of the mirror transistor 44 and the second transistor 36. This comparator gain will be significantly higher than the comparable comparator gain in the network 30 of FIG. 2 and, hence, its comparator action will be more sensitive. In addition, the structure of FIG. 3 uses less circuit area because the area of four transistors and a resistor is significantly less than that of two resistors in integrated circuit realizations of the networks 30 and 40.

In addition, a voltage limiter 47 is coupled between the diode-coupled transistor 35 and the second transistor 36 to protect the second transistor in situations where the potential of the circuit substrate 22 drops significantly as indicated by the dropping arrow 50. This limiter is formed by a series resistor 48 and a shunt zener diode 49 which has a selected breakdown voltage. The limiter is configured so that the zener diode 49 safely limits the gate-to-source voltage $V_{gs}$ of the second transistor 36 to the selected breakdown voltage as the circuit substrate 22 falls below the circuit ground 21. At the same time, the resistor 48 safely limits the current through the zener diode 49.

Finally, a drain clamp 51 is formed by inserting an additional mirror transistor 52 into the current mirror 42, by arranging a diode-coupled transistor 53 to receive the current of the mirror transistor 52, and by adding a transistor 54 that is gate-coupled to the diode-coupled transistor 53 with its source coupled to the drain of the diode-coupled transistor 35.

If the circuit substrate 22 drops sufficiently, current through the resistor 48 and the zener diode 49 may be more than that available from the mirror transistor 43 and this condition will cause the drain potential of the diode-coupled transistor 35 to fall below that of this transistor's body. This latter condition may cause injection of minority carriers into the circuit substrate and this may initiate circuit malfunction in other circuits that are carried on or in the circuit substrate 22. This potentially-damaging condition is avoided by addition of the drain clamp 51 which limits the voltage at the drain of the diode-coupled transistor 35. Essentially, the drain potential of the diode-coupled transistor 35 is clamped so that it does not fall below the drain potential of the diode-coupled transistor 53.

Figure 5:
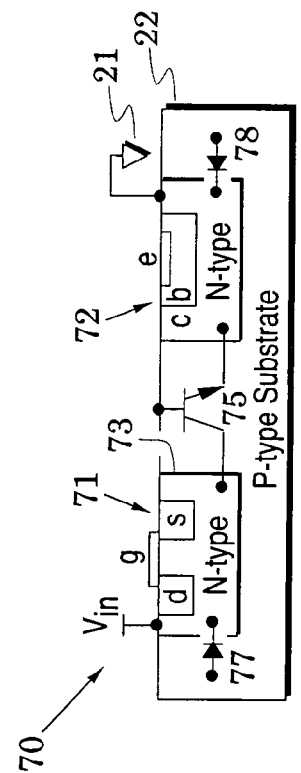
FIG. 5 illustrates typical integrated circuit chip structure.

FIG. 5 illustrates another clamp network embodiment 60 that includes elements of the network 40 of FIG. 3 with like elements indicated by like reference numbers. In contrast, however, the transistors 43, 44 and 52 are now replaced by long-channel transistors 43L, 44L and 52L who set their currents when their channels pinch off. To protect the gates of these transistors from electrostatic discharge (ESD), a resistor 62 couples them to the circuit ground 21.

Drain current for a given gate-to-source voltage is flatter in long-channel transistors (transistors with gate lengths greater than, for example, 0.5 μm) which means that their output impedance is higher than that of transistors with shorter channels. This will tend to further increase comparator gain and further enhance the sensitivity of the clamp network. In addition, the arrangement of the network 60 reduces the area of the integrated circuit because it eliminates the need for the diode-coupled transistor 45 of FIG. 3

For exemplary purposes, the transistors of the clamp network embodiments of FIGS. 1-4 have been introduced as N-type metal-oxide-semiconductor transistors and, hence, the control terminal of the clamp transistor 28 is shown as a gate. These networks can be easily modified into additional network embodiments, however, by substituting other transistor families (e.g., bipolar junction transistors) and/or other transistor types (e.g., P-type transistors).

The clamp networks of FIGS. 1-3 are especially suited for preventing circuit malfunction in integrated circuits. For illustrative purposes, FIG. 5 illustrates an exemplary integrated circuit 70 that includes a metal-oxide-semiconductor transistor 71 and a bipolar junction transistor 72 embedded in a P-type substrate which can be considered to be the circuit substrate 22 of FIGS. 1-4. The transistor 71 has its source, gate and drain elements (indicated by letters s, g and e) formed in an N-type body 73 that is tied to the supply voltage $V_{in}$ and the transistor 72 has its emitter and base elements formed in a collector well (indicated by letters e, g and c) that is tied to the circuit ground 21 of FIGS. 1-4. It is apparent that the structure of the integrated circuit 70 also forms a parasitic NPN transistor 75.

As the input voltage $V_{in}$ begins to rise after turn on, unpredicted and undesirable effects may occur. If, for example, elements of the integrated circuit generate currents that begin to drive the circuit substrate 22 above the circuit ground 21 (as indicated by the rising arrow 28 in FIG. 1), then P-N junctions (such as those indicated by diodes 77 and 78) become forward biased so that they inject minority carriers into the circuit substrate 22. Subsequent actions depend on the actual circuit topology and layout but the possibility exists that these carriers are urged by the electric field of an N-type region so as to turn on the parasitic transistor 75. This action defeats the junction isolation of the integrated circuit which may lead to circuit malfunction and possible destructive latch-up.

As previously mentioned, this problem may result when on-chip circuits generate a substrate voltage to bias the chip substrate. As the input voltage $V_{in}$ begins to rise, latch-up may occur before the on-chip circuits have fully established the substrate voltage. Although the possibility of latch-up is reduced if the substrate voltage is generated off-chip and is established prior to turn on of the input voltage $V_{in}$, protection against latch-up may still be less than desired.

Although various conventional protective structures have been proposed to prevent the above-described problem, they are generally not dependable or they contribute undesirable effects. For example, a fairly large capacitor can be coupled between the circuit substrate and ground. Because it takes time to charge this capacitor, the potential of the circuit substrate moves slowly and this allows time for the integrated circuit potentials to properly stabilize. The effectiveness of this structure has been found to be marginal, however, due to the effect of various unknown or poorly-controlled circuit parameters.

Alternatively, dielectric regions can be inserted into the integrated circuit to maintain the desired isolation between circuit elements. This can be effective solution but it is also a costly solution.

In another protective structure, a Schottky diode may be arranged to clamp the circuit substrate to a negative potential (e.g., −400 mv) relative to the circuit ground. This solution is also effective but it adds considerable cost and uses a large amount of valuable circuit space.

A level shifter can be introduced to establish the lower potential of the circuit substrate with the remainder of the network operating with a separate substrate that is biased at circuit ground. The turn on of the level shifter can then be delayed until the remainder of the network has turned on and established other potentials. This type of network is generally able to safely drive the circuit substrate below the circuit ground. Unfortunately, it is more costly and is still prone to circuit latch-up. In this embodiment, the level shifter and the remainder of the network can either be separate integrated circuits or can be separate chips of a single integrated circuit.

In contrast, the clamp networks of FIGS. 1-4 are simple, effective and relatively economical. As shown in the integrated circuit chip 80 of FIG. 6, a clamp network 82 is arranged in the chip structure so that it is connected to the input voltage $V_{in}$ and to circuit ground and so that its clamp transistor (26 in FIG. 1) is connected between the chip substrate 84 and the chip ground 85. The chip 80 also includes a power conditioning system 86 (e.g., formed with conditioning elements such as a switching regulator, dc-dc converter and/or charge pump) that is powered by the input voltage $V_{in}$ and is arranged to power the various circuits of the chip and, as part of this function, to drive the potential of the chip substrate 84 negative relative to the circuit ground 85.

As described above, clamp networks, such as the network 82, insure proper chip operation by configuring a comparator (24 in FIG. 1) to provide a comparison signal that indicates differences between the potentials of the substrate 84 and the circuit ground 85 and by providing a clamp transistor (26 in FIG. 1) that is coupled between the substrate and the circuit ground and that has a control terminal that responds to the comparison signal. It is important to note that the clamp network is preferably formed to operate independently from all other portions of the integrated circuit. Once the power conditioning system 86 successfully establishes chip potentials (including the substrate potential), the function of the clamp network substantially ceases.

The embodiments of the invention described herein are exemplary and numerous modifications, variations and rearrangements can be readily envisioned to achieve substantially equivalent results, all of which are intended to be embraced within the spirit and scope of the appended claims.

We claim:

1. A clamp network, comprising:
  a comparator configured to provide a comparison signal that indicates differences between first and second potentials of respective first and second circuit structures; and
  a clamp transistor coupled between said first and second structures and having a control terminal responsive to said comparison signal;
  said network thereby arranged to clamp said second potential relative to said first potential with current from said clamp transistor;
  wherein said first structure is a circuit ground and said second structure is a circuit substrate.

2. The network of claim 1, wherein said clamp transistor is arranged to provide a current to at least one of said first and second structures.

3. The network of claim 1, wherein said control terminal is a gate.

4. A clamp network, comprising:
  a comparator configured to provide a comparison signal that indicates differences between first and second potentials of respective first and second circuit structures; and
  a clamp transistor coupled between said first and second structures and having a control terminal responsive to said comparison signal;
  said network thereby arranged to clamp said second potential relative to said first potential with current from said clamp transistor;
  wherein said comparator comprises:
  a first resistor;
  a second resistor coupled to said control terminal;
  a diode-coupled transistor coupled between said first resistor and said first structure; and
  a second transistor coupled between said control terminal and said second structure wherein said diode-coupled transistor and said second transistor have coupled control terminals.

5. The network of claim 4, wherein said control terminals are gates.

6. The network of claim 4, wherein said diode-coupled, second and clamp transistors are N-type transistors.

7. The network of claim 1, wherein said comparator comprises:
  a current mirror arranged to provide first and second currents;
  a diode-coupled transistor coupled to said first structure and arranged to receive said first current; and
  a second transistor coupled between said control terminal and said second structure and arranged to receive said second current wherein said diode-coupled transistor and said second transistor have coupled control terminals.

8. The network of claim 7, wherein said control terminals are gates.

9. The network of claim 7, wherein said diode-coupled, second and clamp transistors are N-type transistors.

10. A clamp network to clamp the second potential of a second circuit structure relative to the first potential of a first circuit structure, comprising:
- a clamp transistor having a control terminal and coupled to provide a current between said first and second structures in response to a comparison signal; and
- a comparator arranged to provide said comparison signal to said control terminal in response to a difference between said first and second potentials;
- said current thereby controlling said difference;
- wherein said comparator comprises:
- a first long-channel transistor;
- a second long-channel transistor coupled to said control terminal;
- a diode-coupled transistor coupled between said first long-channel transistor and said first structure; and
- a third transistor coupled between said control terminal and said second structure wherein said diode-coupled transistor and said third transistor have coupled control terminals.

11. A clamp network to clamp the second potential of a second circuit structure relative to the first potential of a first circuit structure, comprising:
- a clamp transistor having a control terminal and coupled to provide a current between said first and second structures in response to a comparison signal; and
- a comparator arranged to provide said comparison signal to said control terminal in response to a difference between said first and second potentials;
- said current thereby controlling said difference;
- wherein said comparator comprises:
- a current mirror arranged to provide first and second currents;
- a diode-coupled transistor coupled to said first structure and arranged to receive said first current; and
- a second transistor coupled between said control terminal and said second structure and arranged to receive said second current wherein said diode-coupled transistor and said second transistor have coupled control terminals.

12. The network of claim 11, further including:
- a zener diode coupled to said coupled a control terminal of said second transistor; and
- a resistor inserted between the control terminals of said diode-coupled and second transistors;
- said second transistor thereby protected.

13. The network of claim 11, wherein said current mirror is arrange to provide a third current and further including:
- a second diode-coupled transistor inserted to carry said third current; and
- a third transistor gate-coupled to said second diode-coupled transistor and arranged to drive said diode-coupled transistor;
- injection of minority carriers thereby reduced.

14. An integrated circuit chip, comprising:
- a semiconductor substrate formed of a first-type semiconductor;
- islands of a second-type semiconductor arranged in said substrate; and
- a clamp network to clamp a substrate potential of said substrate relative to a ground potential of a circuit ground wherein said clamp network includes:
  - a clamp transistor having a control terminal and coupled to provide a current between said circuit ground and said substrate in response to a comparison signal; and
  - a comparator arranged to provide said comparison signal to said control terminal in response to a difference between said substrate and ground potentials;
- said current thereby controlling said difference.

15. The chip of claim 14, wherein said comparator comprises:
- a first resistor;
- a second resistor coupled to said control terminal;
- a diode-coupled transistor coupled between said first resistor and said circuit ground; and
- a second transistor coupled between said control terminal and said substrate wherein said diode-coupled transistor and said second transistor have coupled control terminals.

16. The chip of claim 14, wherein said comparator comprises:
- a first long-channel transistor;
- a second long-channel transistor coupled to said control terminal;
- a diode-coupled transistor coupled between said first long-channel transistor and said ground; and
- a third transistor coupled between said control terminal and said substrate wherein said diode-coupled transistor and said third transistor have coupled control terminals.

17. The chip of claim 14, wherein said comparator comprises:
- a current mirror arranged to provide first and second currents;
- a diode-coupled transistor coupled to said circuit ground and arranged to receive said first current; and
- a second transistor coupled between said control terminal and said substrate and arranged to receive said second current wherein said diode-coupled transistor and said second transistor have coupled control terminals.

* * * * *